US007183185B2

(12) United States Patent
Scott

(10) Patent No.: US 7,183,185 B2
(45) Date of Patent: *Feb. 27, 2007

(54) METHODS OF FORMING TRANSISTOR GATES; AND METHODS OF FORMING PROGRAMMABLE READ-ONLY MEMORY CONSTRUCTIONS

(75) Inventor: Winston G. Scott, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/260,753

(22) Filed: Oct. 26, 2005

(65) Prior Publication Data

US 2006/0046451 A1    Mar. 2, 2006

Related U.S. Application Data

(63) Continuation of application No. 10/635,715, filed on Aug. 5, 2003, now Pat. No. 6,995,080, which is a continuation of application No. 09/876,722, filed on Jun. 6, 2001, now Pat. No. 6,627,524.

(51) Int. Cl.
*H01L 21/3205* (2006.01)
(52) U.S. Cl. .............................. 438/585; 257/E21.177; 257/E21.179; 438/593
(58) Field of Classification Search ................ 438/585, 438/587, 593–594; 257/E21.177, E21.179
See application file for complete search history.

(56) References Cited

U.S. PATENT DOCUMENTS

| 5,688,705 | A | 11/1997 | Bergemont |
| 5,858,847 | A | 1/1999 | Zhou et al. |
| 5,866,448 | A | 2/1999 | Pradeep et al. |
| 6,033,952 | A | 3/2000 | Yasumura et al. |
| 6,124,168 | A | 9/2000 | Ong |
| 6,627,524 | B2 * | 9/2003 | Scott ......................... 438/588 |
| 6,995,080 | B2 * | 2/2006 | Scott ......................... 438/585 |

OTHER PUBLICATIONS

Watanabe, H. et al., *Novel 0.44 μm² Ti-Salicide STI Cell Technology for High-Density NOR Flash Memories and High Performance Embedded Application*, IEEE 1998, pp. 36.2.1-36.2.4.
Wolf, S., "*Silicon Processing for the VLSI Era*", Lattice Press 1986 vol. 2, pp. 632-635.
Mitsubishi Electric Website: Reprinted from website http://www.mitsubishielectric.com/r_and_d/tech_showcase/ts8.php on Mar. 29, 2001: "8. Production Line Application of a Fine Hole Pattern-Formation Technology for Semiconductors", on Mar. 29, 2001, 4 pgs.

(Continued)

*Primary Examiner*—Richard A. Booth
(74) *Attorney, Agent, or Firm*—Wells St. John P.S.

(57) ABSTRACT

The invention includes a method of forming a transistor gate. One or more conductive materials are formed over a semiconductor substrate, and a block is formed over the one or more conductive materials. The block comprises a photoresist mass and a material other than photoresist which is against the photoresist. A pattern is transferred from the block to the one or more conductive materials to pattern a transistor gate construction from the one or more conductive materials.

17 Claims, 3 Drawing Sheets

OTHER PUBLICATIONS

Cahners Semiconductor International Website: Reprinted from http://www.semiconductor.net/semiconductor/issues/1999/sep99/docs/feature1.asp on Mar. 29, 2001: "*Resists Join the Sub-λ Revolution*", 9 pgs.

Cahners Semiconductor International Website: Reprinted from http://www.semiconductor.net/semiconductor/issues/1999/aug99/docs/lithography.asp on Mar. 29, 2001: "*Paths to Smaller Features*", 1 pg.

Wolf, S., "*Silicon Processing for the VLSI Era*, vol. 1: *Process Technology,* " Lattice Press 1986, pp. 434-437.

\* cited by examiner

METHODS OF FORMING TRANSISTOR GATES; AND METHODS OF FORMING PROGRAMMABLE READ-ONLY MEMORY CONSTRUCTIONS

RELATED PATENT DATA

This patent resulted from a continuation of U.S. patent application Ser. No. 10/635,715, which was filed Aug. 5, 2003 now U.S. Pat. No. 6,995,080; which resulted from a continuation of U.S. patent application Ser. No. 09/876,722, which was filed Jun. 6, 2001, and is now U.S. Pat. No. 6,627,524.

TECHNICAL FIELD

The invention pertains to methods of forming transistor gates; and in particular aspects pertains to methods of forming programmable read-only memory constructions, such as, for example, FLASH memory constructions.

BACKGROUND OF THE INVENTION

Transistor devices are utilized in numerous semiconductor constructions, including, for example, memory constructions. A transistor device will typically comprise a transistor gate adjacent a semiconductive material, and defining a channel region within the semiconductor material. The transistor device will also typically comprise a pair of source/drain regions separated from one another by the channel region.

A specialized type of transistor gate is a so-called floating gate. The term "floating" transistor gate is used to indicate that no electrical connection exists to the gate. The floating gate is charged by injecting hot electrons into the gate, and once the electrons are transferred to the gate they become trapped there.

Floating gates can be incorporated into programmable read-only memory (PROM) constructions, such as erasable PROMs (EPROMS), and electrically erasable PROMs (EEPROMS). Further, the PROMs can be incorporated into FLASH devices, such as, for example, FLASH EEPROMS. A FLASH device is so named because the contents of all of the memory's array cells can be erased simultaneously and rapidly through utilization of an electrical erase signal.

Memory arrays can be fabricated utilizing numerous transistor gates in combination with various capacitor or other circuitry constructions. Frequently, it is desired to fabricate adjacent transistor gates of the memory array close to one another to conserve semiconductor real estate. One method of fabricating transistor gates is to utilize photolithographic processing to form patterned photoresist blocks over transistor gate material. Subsequently, a pattern is transferred from the blocks to the underlying transistor gate material to form transistor gate structures. A minimal spacing between adjacent patterned photoresist blocks is limited by various parameters involved in a photolithographic process. For instance, the wavelength of light utilized in photolithographic processing can limit a minimum spacing between adjacent patterned features due to interference effects which can occur if a minimal spacing between adjacent features is not maintained.

It would be desirable to develop methodology by which a spacing between adjacent transistor gates can be reduced to less than a minimum feature size achievable by photolithographic processing. It is recognized that the minimum feature size achievable by photolithographic processing is continually decreasing due to advances made in semiconductor processing methodologies. However, at any time there is a minimum feature size associated with any particular photolithographic process. It would be desirable to develop a method which can reduce the minimum feature size beyond that achieved by a particular photolithographic process at the time that the process is utilized for fabrication of semiconductor circuitry.

SUMMARY OF THE INVENTION

In one aspect, the invention encompasses a method of forming a transistor gate. One or more conductive materials are formed over a semiconductor substrate, and a block is formed over the one or more conductive materials. The block comprises a photoresist mass and a material other than photoresist which is against the photoresist. A pattern is transferred from the block to the one or more conductive materials to pattern a transistor gate construction from the one or more conductive materials.

In another aspect, the invention encompasses a method of forming at least two programmable read-only memory constructions. At least one conductive material is formed over a semiconductor substrate. At least two patterned photoresist blocks are formed over the conductive material, with a pair of adjacent photoresist blocks being separated by a first gap. A coating is formed over the pair of adjacent photoresist blocks and across the first gap between the adjacent blocks. The coating is selectively removed from across the first gap while leaving the coating on the pair of adjacent photoresist blocks. The pair of photoresist blocks and coating remaining on the pair of photoresist blocks together define a pair of masking blocks that are separated by a second gap. The second gap is narrower than the first gap. A pattern is transferred from the masking blocks to the conductive material to pattern a pair of spaced floating gate constructions from the conductive material. A dielectric material is formed over the spaced floating gate constructions, and a control gate material is formed over the dielectric material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
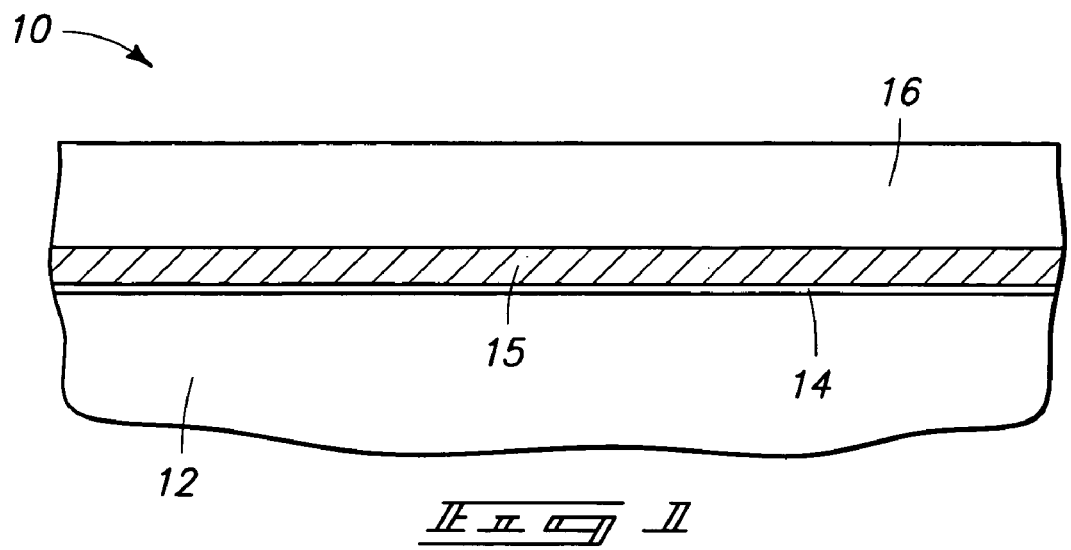
FIG. 1 is a diagrammatic, cross-sectional view of a semiconductor wafer fragment shown at a preliminary processing step of a method of the present invention.

A method of the present invention is described with reference to FIGS. 1–7. Referring initially to FIG. 1, a fragment 10 of a semiconductor construction is illustrated. Fragment 10 comprises a substrate 12. Substrate 12 can be, for example, a monocrystalline silicon wafer lightly doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative material 14 is provided over substrate 12. Material 14 can comprise, for example, silicon dioxide, and can be ultimately utilized as a gate oxide.

A conductive mass 15 is provided over layer 14. Conductive mass 15 comprises at least one conductive material. In particular embodiments, mass 15 can comprise silicon (such as, for example, polycrystalline silicon) conductively doped with suitable n-type and/or p-type dopant. Mass 15 can comprise metals in addition to, or alternatively to, the conductively-doped silicon. In particular embodiments, mass 15 can comprise a layer of conductively-doped silicon, and a layer of metal silicide (such as, for example, tungsten silicide or titanium silicide) on the conductively-doped silicon. Additionally, mass 15 can comprise a layer of metal (such as, for example, tungsten or titanium) on the metal silicide.

A photoresist 16 is provided over conductive mass 15. Photoresist 16 can comprise either positive or negative photoresist, and in particular embodiments can comprise M108Y™ from JSR™ Corporation of Japan.

Figure 2:
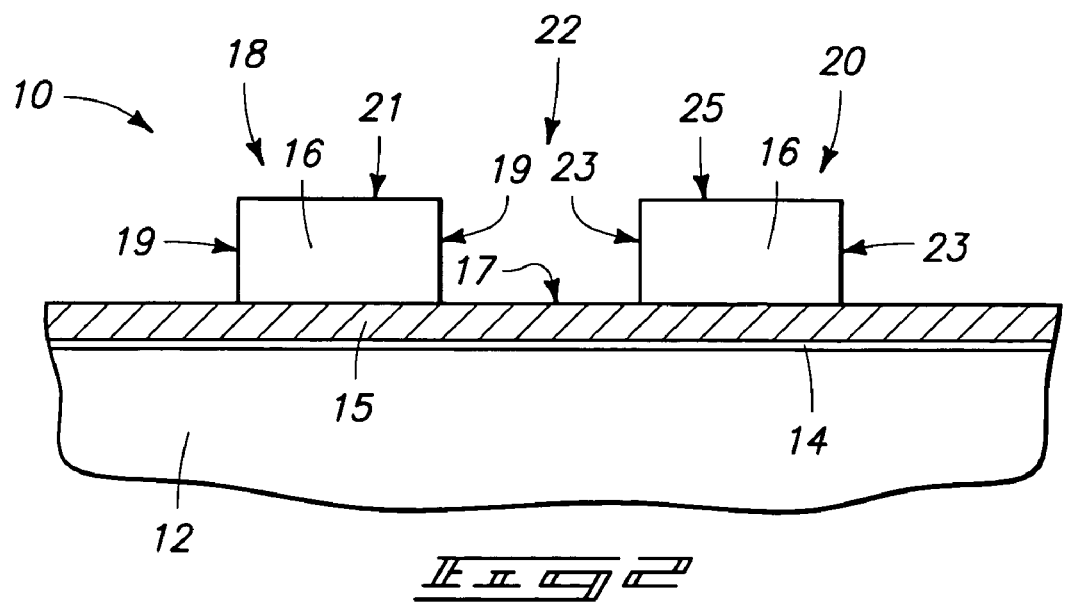
FIG. 2 is a view of the FIG. 1 wafer fragment shown at a processing step subsequent to that of FIG. 1.

Referring to FIG. 2, photoresist 16 is photolithographically patterned into a pair of adjacent and spaced blocks 18 and 20. Block 18 has sidewall edges 19 and a top edge 21; and block 20 has sidewall edges 23 and a top edge 25. Sidewall edges 19 and 23 can alternatively be referred to as lateral edges. It is to be understood that the term "block" is utilized herein to generically refer to any patterned shape, including, for example, rectangular shapes, square shapes, or shapes with curved edges.

In the shown embodiment, blocks 18 and 20 are formed in physical contact with conductive material 15. It is to be understood that the invention encompasses other embodiments (not shown) wherein blocks 18 and 20 can be separated from conductive mass 15 by one or more intervening materials, such as, for example, an intervening dielectric material.

A gap 22 extends between patterned blocks 18 and 20, and in the shown embodiment an upper surface 17 of conductive mass 15 is exposed within gap 22. Patterned blocks 18 and 20 can be considered to cover a first portion of conductive mass 15, and to leave a second portion of mass 15 uncovered.

Figure 3:
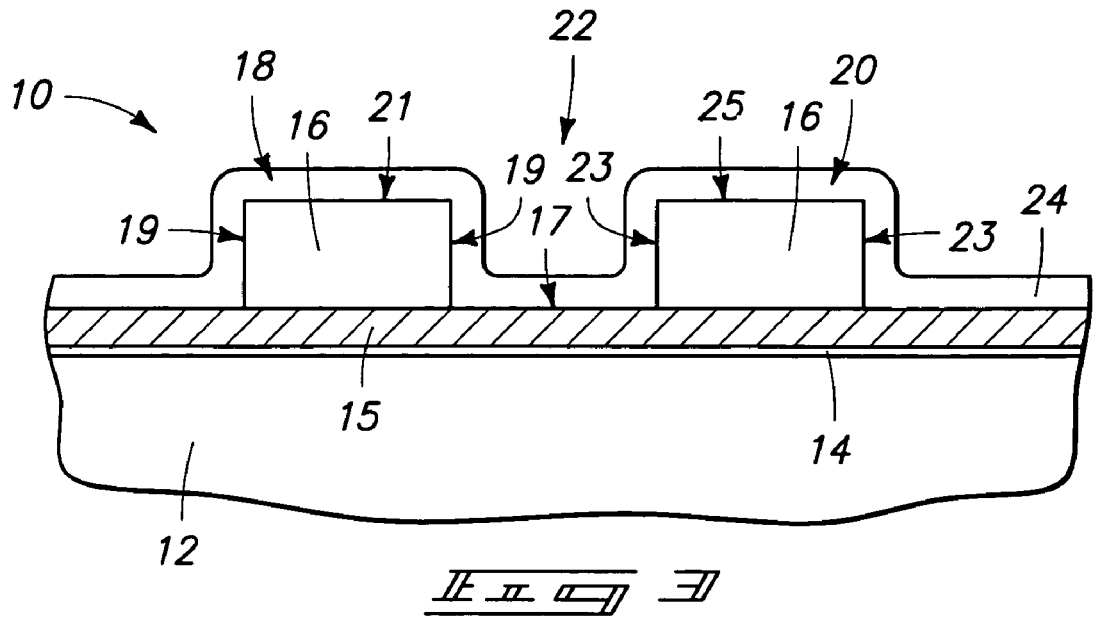
FIG. 3 is a view of the FIG. 1 wafer fragment shown at a processing step subsequent to that of FIG. 2.

Referring to FIG. 3, a coating 24 is formed over patterned photoresist blocks 18 and 20, and within gap 22. Coating 24 covers at least some of the portion of conductive mass 15 that is exposed between blocks 18 and 20, and in the shown embodiment covers all of the exposed portion of conductive mass 15. Coating 24 is a material other than photoresist, and in particular applications corresponds to a material designated as AZ R200™ by Clariant International, Ltd. Coating 24 is physically against photoresist blocks 18 and 20, and corresponds to a material which can be selectively removed from over exposed portion 17 of conductive mass 15, while remaining adhered to the photoresist of blocks 18 and 20. It is noted that although coating 24 is illustrated as an electrically insulative material in the figures (i.e., is not cross-hatched), it is to be understood that the invention encompasses embodiments wherein coating 24 is electrically conductive, as well as encompassing embodiments in which coating 24 is insulative.

In one aspect of the invention, coating 24 corresponds to the material designated as AZ R200™, and is coated across an entirety of a semiconductor wafer, and subsequently spun dry. It is noted that AZ R200™ is a water-based material, so it is preferable to conduct the procedures associated with AZ R200™ in a separate chamber from the procedures utilized in exposing and developing photoresist, since water can interfere with standard photoresist processing. Accordingly, a preferred process of the present invention comprises forming photoresist mass 16 and photolithographically processing such mass in a separate "bowl" or chamber from that utilized during formation of coating 24.

After coating 24 is formed, semiconductor construction 10 is baked at a temperature of from about 100° C. to about 120° C. Such baking is thought to diffuse acid from resist 16 into the AZ R200™, and crosslink the layer of AZ R200™ across resist blocks 18 and 20. The crosslinking can bond the coating to blocks 18 and 20 and/or form the coating into a shell tightly adhered with blocks 18 and 20. The material designated as AZ R200™ is but one material which can be utilized in methodology of the present invention. Other materials which selectively bond or adhere to photoresist blocks 18 and 20 can be used alternatively to the material designated as AZ R200™.

Figure 4:
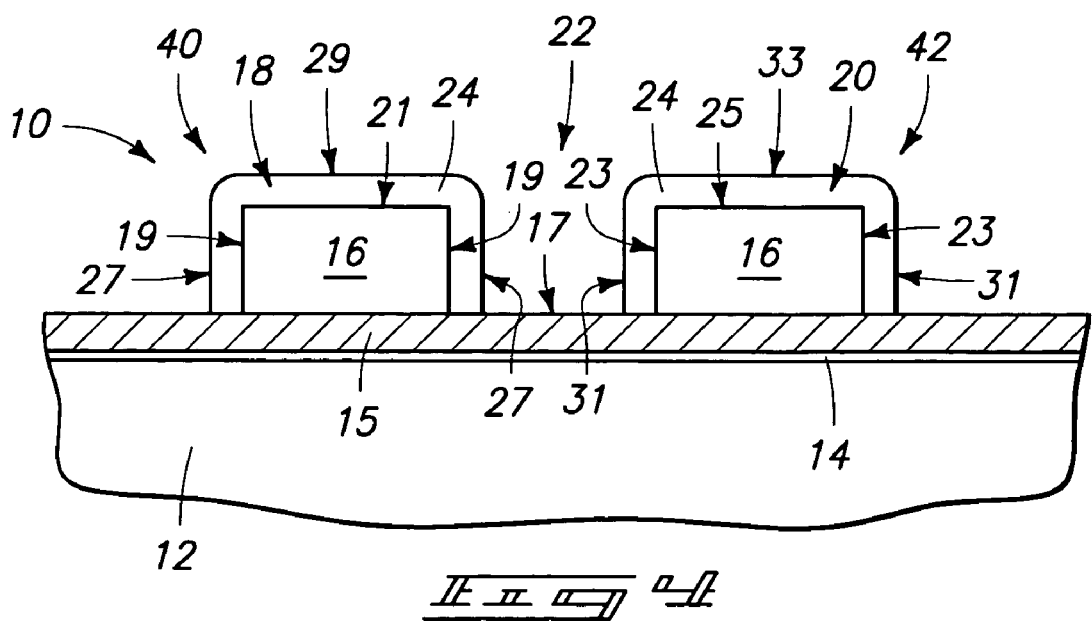
FIG. 4 is a view of the FIG. 1 wafer fragment shown at a processing step subsequent to that of FIG. 3.

Referring to FIG. 4, coating 24 is exposed to conditions which selectively remove the coating from between blocks 18 and 20, while leaving a layer of the coating against blocks 18 and 20. In applications in which the coating comprises AZ R200™, such removal can be accomplished by exposing semiconductor construction 10 to an aqueous solution comprising surfactant. Such solution can selectively remove a non-crosslinked portion of the coating 24. A suitable aqueous surfactant solution is the material marketed as "SOLUTION C™" by Clariant International, Ltd. In applications in which AZ R200™ is utilized, construction 10 can be subjected to a so-called hard bake at a temperature of from about 130° C. to about 140° C. after removal of the non-crosslinked material. Such hard bake can fully dry and further crosslink the portions of coating 24 remaining around blocks 18 and 20.

The coating 24 remaining around a photoresist block can be considered to define a second block which extends laterally outward beyond edges of the photoresist block. Specifically, the coating 24 over photoresist block 18 defines lateral edges 27 which extend laterally outward beyond the lateral edges 19 of block 18, and also defines a top edge 29 which extends elevationally above the top edge 21 of block 18. Similarly, the coating 24 around block 20 comprises lateral edges 31 which extend laterally outward beyond the lateral edges 23 of block 20 and further comprises a top edge 33 which is elevationally above the top edge 25 of block 20.

Photoresist block 18 and the coating 24 surrounding such photoresist block together define a masking block 40 which is laterally wider than was photoresist block 18. Also, photoresist block 20 and the coating 24 surrounding such photoresist block together define a masking block 42 which is laterally wider than photoresist block 20. Masking blocks 40 and 42 have a narrower gap between them than did photoresist blocks 18 and 20. In other words, coating 24 narrows gap 22 to reduce a dimension of such gap.

Figure 5:
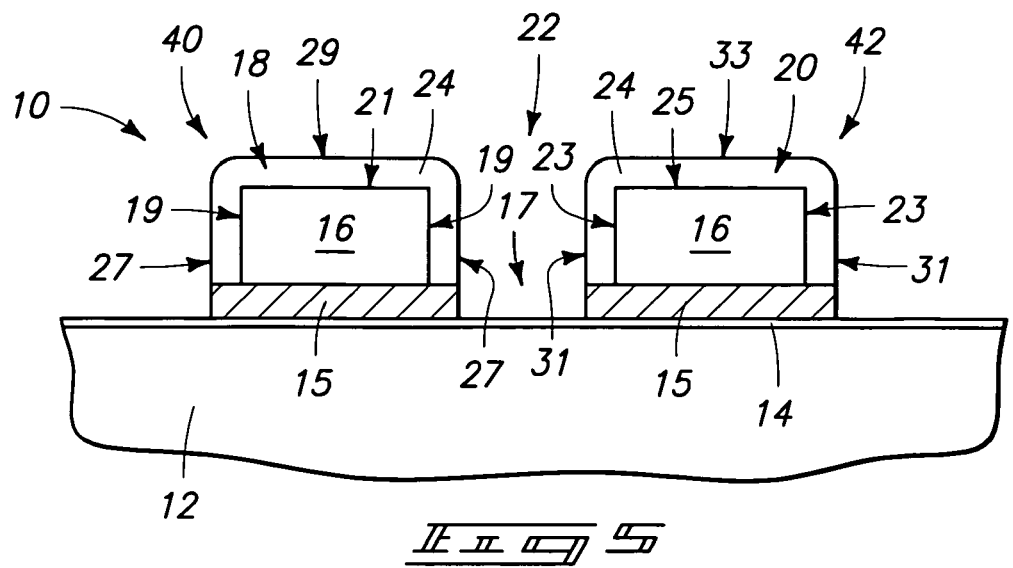
FIG. 5 is a view of the FIG. 1 wafer fragment shown at a processing step subsequent to that of FIG. 4.

Referring to FIG. 5, a pattern is transferred from masking blocks 40 and 42 to the underlying conductive mass 15. In embodiments in which mass 15 comprises conductively doped silicon, such can be accomplished by, for example, a conventional polysilicon etch. In the shown embodiment, the etch has stopped at insulative layer 14. It is to be understood that the invention encompasses other embodiments (not shown) wherein layer 14 is patterned similarly to conductive mass 15.

Figure 6:
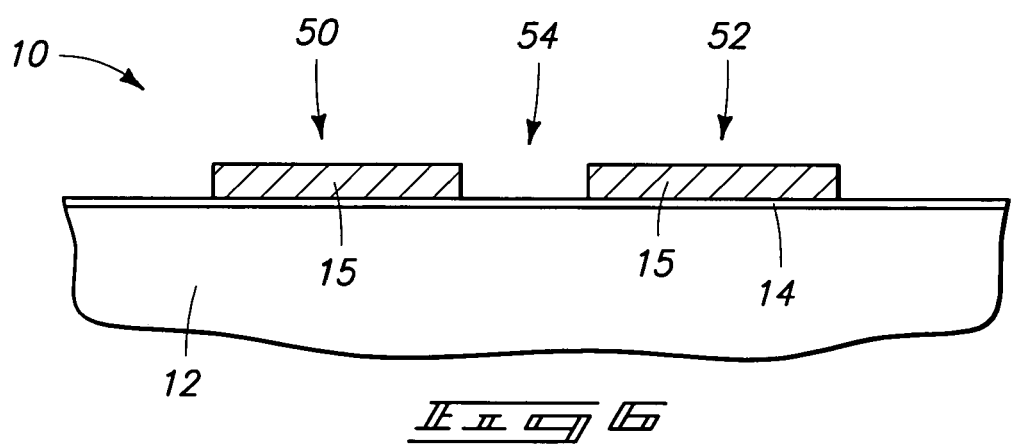
FIG. 6 is a view of the FIG. 1 wafer fragment shown at a processing step subsequent to that of FIG. 5.

Referring to FIG. 6, materials 16 and 24 (FIG. 5) are removed from over patterned mass 15 to leave patterned blocks 50 and 52 of mass 15 over substrate 12. Blocks 50 and 52 are separated by a gap 54 corresponding to the narrowed gap defined by masking blocks 40 and 42 (FIG. 5). It is to be understood that conductive mass 15 would typically be fabricated into lines extending into and out of the page, with the shown blocks 50 and 52 of FIG. 5 illustrating cross-sections through such lines.

Figure 7:
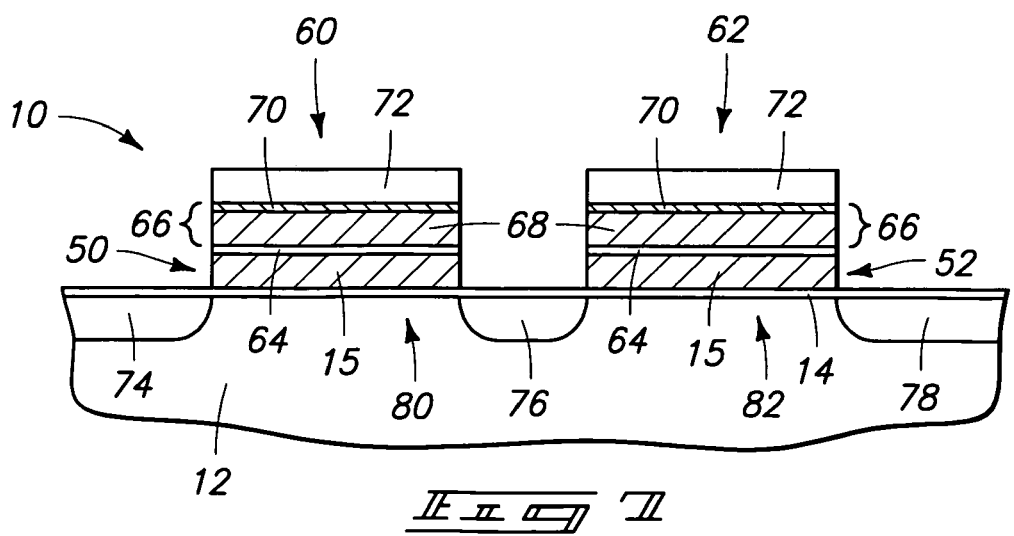
FIG. 7 is a view of the FIG. 1 wafer fragment shown at a processing step subsequent to that of FIG. 6.

Blocks 50 and 52 can subsequently be incorporated into transistor constructions as transistor gates. For instance, FIG. 7 illustrates a pair of programmable read-only memory constructions 60 and 62 comprising conductive blocks 50 and 52, respectively. Constructions 60 and 62 can comprise FLASH memory devices.

Blocks 50 and 52 have been incorporated as floating transistor gates within the constructions 60 and 62. More specifically, a dielectric material 64 has been provided over blocks 50 and 52, and subsequently a conductive mass 66 is provided over dielectric material 64. Conductive mass 66 is shown comprising two conductive materials, with a lower of the two conductive materials being conductively doped silicon 68 and an upper of the two materials being silicide 70. Conductive mass 66 can be considered to define a pair of control gates which are provided over floating gates 50 and 52 in the programmable read-only memory constructions 60 and 62. An insulative material 72 is shown formed over conductive mass 66.

Materials 64, 68, 70 and 72 can be formed by conventional methods. Dielectric material 64 can comprise, for example, silicon dioxide and/or silicon nitride; and conductively doped silicon can comprise, for example, n-type or p-type doped polycrystalline silicon. Silicide 70 can comprise, for example, tungsten silicide or titanium silicide. Insulative material 72 can comprise, for example, silicon nitride.

Channel regions 80 and 82 are defined beneath floating gates 50 and 52, respectively; and source/drain regions 74, 76 and 78 are shown formed within substrate 12 and proximate channel regions 80 and 82. Source/drain regions 74, 76 and 78 can be formed by implanting conductivity-enhancing dopant into substrate 12 after patterning blocks 50 and 52. In particular embodiments, regions 74, 76 and 78 can be formed at the processing step shown in FIG. 5, with masking blocks 40 and 42 protecting conductive mass 15 during the implant of the source/drain regions.

The processing of FIGS. 1–7 can, in one embodiment, be considered a novel application of a so-called Resolution Enhancement Lithography Assisted by Chemical Shrink (RELACS™) process that has been developed by Mitsubishi Electric Corporation.

The present invention can advantageously form transistor gates which are closer together than can be accomplished utilizing photolithographic processing alone. Specifically, if photoresist blocks 18 and 20 (FIG. 4) are considered to be as close to one another as is possible by a particular photolithographic patterning process, then processing of the present invention has effectively defined new masking blocks (40 and 42) which are closer together than could be achieved by photolithographic processing alone. In other words, if gap 22 was initially formed to have a minimum feature size achievable by photolithographic processing, then the formation of coating 24 has effectively reduced the feature size of gap 22 to below the minimum achievable feature size.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a transistor gate, comprising:
   forming a conductive material over a semiconductor substrate;
   forming a block over and physically against the conductive material; the block consisting of photoresist and a single material other than photoresist which is against the photoresist, the block having a lowermost substantially planar surface extending along the conductive material and comprising both the photoresist and the single material other than photoresist; and
   transferring a pattern from the block to the conductive material to pattern a transistor gate construction comprising the conductive material.

2. The method of claim 1 further comprising removing the block from over the transistor gate construction.

3. The method of claim 1 further comprising defining a channel region within the semiconductor substrate beneath the transistor gate construction; and forming source/drain regions within the semiconductor substrate and spaced from one another by the channel region.

4. The method of claim 1 wherein the photoresist releases an acid, and wherein the material other than photoresist is a coating which cross-links when exposed to the acid from the photoresist.

5. A method of forming a transistor gate, comprising:
   providing a semiconductor substrate; said semiconductor substrate comprising a monocrystalline silicon wafer;
   forming one or more conductive materials over the semiconductor substrate;
   providing a photoresist block which is over a first portion of the one or more conductive materials and not over a second portion of the one or more conductive materials;
   forming a layer over the photoresist block and over at least some of the second portion of the one or more conductive materials, the layer having a first segment that is against the photoresist block and a second segment that is not against the photoresist block;
   treating the layer so that the first segment becomes different than the second segment;
   after the treating, selectively removing the second segment of the layer while leaving the first segment of the layer; the photoresist block and remaining first segment together defining a masking block that is laterally wider than the photoresist block; and transferring a pattern from the masking block to the one or more conductive materials to pattern a transistor gate construction from the one or more conductive materials.

6. The method of claim 5 further comprising removing the masking block from over the transistor gate construction.

7. The method of claim 5 further comprising defining a channel region within the semiconductor substrate beneath the transistor gate construction; and forming source/drain regions within the semiconductor substrate and spaced from one another by the channel region.

8. The method of claim 5 wherein the treatment includes causing the photoresist to release an acid which forms cross-links within the first segment of the layer.

9. A method of forming a programmable read-only memory construction, comprising:
    forming a conductive material over a semiconductor substrate;
    forming a block over the conductive material; the block consisting of a photoresist mass and a single material other than photoresist which is against the photoresist, the block having a lowermost substantially planar surface extending along the conductive material and comprising both the photoresist and the single material other than photoresist;
    transferring a pattern from the block to the conductive material to pattern a floating gate construction comprising the conductive material;
    forming a dielectric material over the floating gate construction; and
    forming a control gate over the dielectric material.

10. The method of claim 9 further comprising defining a channel region within the semiconductor substrate beneath the floating gate construction; and forming source/drain regions within the semiconductor substrate and spaced from one another by the channel region.

11. The method of claim 9 wherein the photoresist releases an acid, and wherein the material other than photoresist is a coating which cross-links when exposed to the acid from the photoresist.

12. The method of claim 9 wherein the control gate, dielectric material and floating gate are incorporated into a FLASH memory device.

13. A method of forming at least two programmable read-only memory constructions, comprising:
    forming at least one conductive material over a semiconductor substrate;
    forming at least two patterned photoresist blocks over the conductive material; a pair of adjacent photoresist blocks being separated by a first gap;
    forming a layer on the pair of adjacent photoresist blocks and across the first gap between the adjacent blocks, the layer having segments that are against the photoresist blocks and at least one segment that is not against the photoresist blocks, the at least one segment that is not against the photoresist blocks including a region of the layer that extends across the first gap, the segments that are against the photoresist blocks including regions of the layer that are on the pair of adjacent photoresist blocks;
    treating the layer so that the segments that are against the photoresist blocks become different than the at least one segment that is not against the photoresist blocks;
    after the treating, selectively removing the region of the layer from across the first gap while leaving the layer on the pair of adjacent photoresist blocks; the pair of photoresist blocks and layer remaining thereon together defining a pair of masking blocks that are separated by a second gap; the second gap being narrower than the first gap;
    transferring a pattern from the masking blocks to the conductive material to pattern a pair of spaced floating gate constructions from the conductive material;
    forming a dielectric material over the spaced floating gate constructions; and
    forming control gate material over the dielectric material.

14. The method of claim 13 wherein the treating includes causing the photoresist to release an acid which forms cross-links within the layer.

15. The method of claim 13 wherein the control gate material, dielectric material and floating gates are incorporated into a pair of FLASH memory devices.

16. The method of claim 13 wherein the patterned photoresist blocks are formed by a photolithographic process; wherein the photolithographic process is limited to a minimum feature size that can be obtained by the photolithographic process; and wherein a distance between the spaced floating gate constructions is less than said minimum feature size.

17. The method of claim 16 wherein the first gap corresponds to about said minimum feature size.

* * * * *